United States Patent

Higashi et al.

[11] Patent Number: 5,918,113
[45] Date of Patent: Jun. 29, 1999

[54] PROCESS FOR PRODUCING A SEMICONDUCTOR DEVICE USING ANISOTROPIC CONDUCTIVE ADHESIVE

[75] Inventors: Mitsutoshi Higashi; Masatoshi Akagawa, both of Nagano, Japan

[73] Assignee: Shinko Electric Industries Co., Ltd., Nagano, Japan

[21] Appl. No.: 08/895,145

[22] Filed: Jul. 16, 1997

[30] Foreign Application Priority Data

Jul. 19, 1996 [JP] Japan .................................. 8-190409
May 28, 1997 [JP] Japan .................................. 9-138579

[51] Int. Cl.[6] .......................... H01L 21/44; H01L 21/48; H01L 21/50
[52] U.S. Cl. .......................... 438/119; 438/118; 438/113; 438/108; 438/455; 438/458; 438/460; 438/462; 438/464
[58] Field of Search .................................... 438/108, 113, 438/118, 119, 455, 458, 460, 462, 464, FOR 386

[56] References Cited

U.S. PATENT DOCUMENTS

| | | | |
|---|---|---|---|
| 5,118,370 | 6/1992 | Ozawa | 156/73.1 |
| 5,120,665 | 6/1992 | Tsukagoshi et al. | 437/8 |
| 5,323,051 | 6/1994 | Adams et al. | 257/417 |
| 5,352,318 | 10/1994 | Takabayashi et al. | 156/272.6 |
| 5,604,160 | 2/1997 | Warfield | 437/209 |
| 5,661,042 | 8/1997 | Fang et al. | 438/17 |

FOREIGN PATENT DOCUMENTS 3-40445  2/1991  Japan .
9-36143  2/1997  Japan .

Primary Examiner—John F. Niebling
Assistant Examiner—David A. Zarneke
Attorney, Agent, or Firm—Pennie & Edmonds LLP

[57] ABSTRACT

A process for producing a semiconductor device includes a step of forming an anisotropic conductive adhesive layer, which includes a thermoplastic or thermosetting resin and conductive powder dispersed therein, on a surface of a circuit board on which electrode terminal contacts are arranged so as to correspond to electrode terminals of a semiconductor chip which is to be mounted on said circuit board. Then, the anisotropic conductive adhesive layer is softened and the semiconductor chip is placed in such a manner that the electrode terminals coincide with the electrode terminal contacts through the anisotropic conductive adhesive layer. The semiconductor chip is heat-pressed against the circuit board so that the electrode terminals are electrically connected to the electrode terminal contacts and simultaneously the semiconductor chip is physically fixed to the circuit board when the anisotropic conductive adhesive layer is hardened.

14 Claims, 7 Drawing Sheets

PROCESS FOR PRODUCING A SEMICONDUCTOR DEVICE USING ANISOTROPIC CONDUCTIVE ADHESIVE

BACKGROUND OF THE INVENTION

1. Field of the Invention

The present invention relates to a process for producing a semiconductor device and, more particularly, to a process for producing a semiconductor device using an anisotropic conductive adhesive layer.

2. Description of the Related Art

Semiconductor devices have been known in the prior art, in which a semiconductor chip is mounted onto a circuit board by a flip-chip bonding method.

In such a semiconductor device, electrode terminals are provided on a surface of a semiconductor chip to be bonded to circuit patterns formed on the individually separated circuit boards. The semiconductor chip carrying a conductive material such as a solder on a tip ends of respective electrode terminals is mounted onto the circuit board. At that time, the electrode terminals are placed while corresponding to electrode terminal contacts formed on the circuit patterns on the circuit boards. Thereafter, the assembly is heated while maintaining this state so that the conductive material is molten to electrically connect the electrode terminals with the circuit patterns. Then, an underfiller (mainly composed of epoxy resin) is filled in a gap between the semiconductor chip and the circuit boards, and then heated to be cured. Finally, external terminal contacts such as solder balls or lead pins are bonded to lands formed on a surface of the circuit board opposite to the surface thereof carrying the circuit patterns. Thus, the semiconductor device is completed.

The prior art process for producing a semiconductor device described above, however, has a drawback in that the production efficiency is inferior because it requires the underfiller-filling process and the curing process.

In addition, semiconductor chips are necessarily mounted and bonded onto individually separated circuit boards, respectively, which also reduces the production efficiency.

Also, there is a further problem if a paste containing metallic filler therein is used as the conductive material in that the semiconductor chip mounted on the circuit board is liable to move because the paste itself has no adhesiveness.

SUMMARY OF THE INVENTION

Accordingly, an object of the present invention is to provide a process for producing a semiconductor device, capable of simplifying the process and suitably treating a plurality of circuit boards to improve the production efficiency.

According to the present invention, there is provided a process for producing a semiconductor device, said process comprising the following steps of: forming an anisotropic conductive adhesive layer, which includes a thermoplastic or thermosetting resin and conductive powder dispersed therein, on a surface of a circuit board on which electrode terminal contacts are arranged so as to correspond to electrode terminals of a semiconductor chip which is to be mounted on said circuit board; softening said anisotropic conductive adhesive layer; placing said semiconductor chip in such a manner that said electrode terminals of the semiconductor chip coincide with said electrode terminal contacts of the circuit board through said anisotropic conductive adhesive layer; and pressing said semiconductor chip against said circuit board so that said electrode terminals electrically connect to said electrode terminal contacts and, simultaneously, said semiconductor chip is physically fixed to said circuit board when said anisotropic conductive adhesive layer is hardened.

If a conductive adhesive layer is formed by an anisotropic conductive resin film and a circuit board is made of a flexible resin substrate, it will be possible to continuously supply the both from reels. Also, if the anisotropic conductive adhesive layer is of a frame shape formed along rows of electrode terminal contacts, it will be possible to restrict the swelling-out of the adhesive. Thus, the production efficiency of the semiconductor device can be improved.

Also, it is possible to effectively form the anisotropic conductive adhesive layer on a strip-like circuit board by applying the same sequentially onto at least part of a surface of the circuit board including semiconductor chip-mounting areas in the longitudinal direction of the strip-like circuit board.

The circuit board has lands on a surface thereof opposite to the surface carrying the circuit patterns, which are electrically connected to the circuit patterns and, after the semiconductor chip has been mounted to the circuit board, bonded to external terminals, whereby it is possible to effectively produce the semiconductor device.

According to another aspect of the present invention, there is provided a process for producing a semiconductor device, said process comprising the following steps of: preparing a semiconductor wafer forming a plurality of semiconductor chips having bump-like electrode terminals; preparing a wafer-mounting substrate having electrode terminal contacts arranged so as to correspond to said electrode terminals; forming an anisotropic conductive adhesive layer, which includes a thermoplastic or thermosetting resin and conductive particles dispersed therein, on a surface of said wafer-mounting substrate on which said electrode terminal contacts are arranged; placing said semiconductor wafer in such a manner that said electrode terminals of the semiconductor wafer coincide with said electrode terminal contacts of the wafer-mounting substrate through said anisotropic conductive adhesive layer; pressing said semiconductor wafer against said wafer-mounting substrate so that said electrode terminals electrically connected to and, simultaneously, said semiconductor wafer is fixed to said electrode terminal contacts and to said circuit board; and cutting said semiconductor wafer and said wafer-mounting substrate into individual pieces including respective semiconductor chip.

DETAILED DESCRIPTION OF THE EMBODIMENTS

The present invention will be described in more detail below with reference to the preferred embodiments illustrated in the attached drawings.

Figure 1:
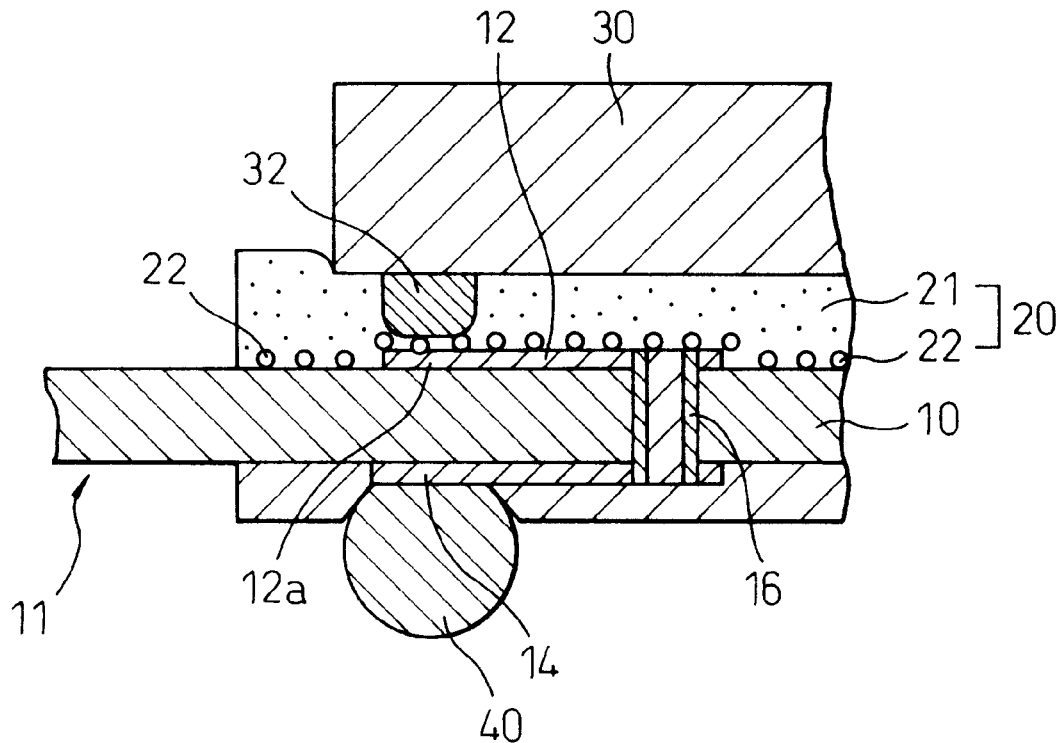
FIG. 1 is a sectional view of one embodiment of a semiconductor device obtained by a production method according to the present invention.
Figure 2:
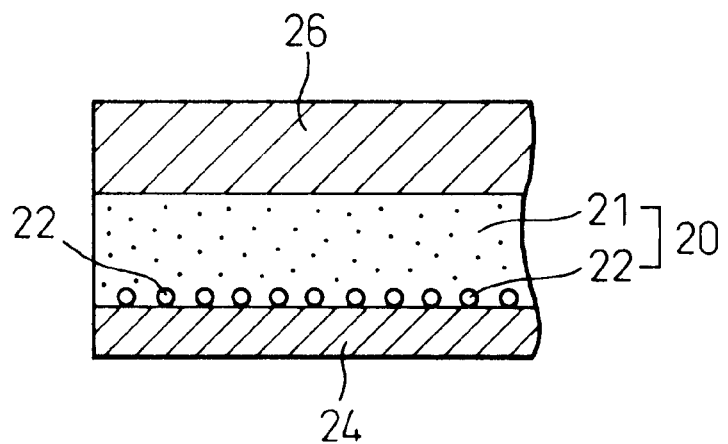
FIG. 2 is a sectional view of one embodiment of an anisotropic conductive adhesive film.

FIG. 1 is a sectional view of one embodiment of a semiconductor device produced by a process according to the present invention. FIG. 2 is a sectional view of one example of an isotropic conductive adhesive used in the present invention.

A circuit board 10 has a circuit pattern 12 on a surface thereof. A strip-like substrate 11 is formed by coupling a plurality of such circuit boards 10 with each other in the longitudinal direction. There are no limitations in material and shape of the circuit board 10. Examples of the circuit board 10 include a flexible substrate capable of being wound in a reel form such as FPC (flexible printed circuit) or TAB, or a rigid substrate such as PCB (printed circuit board) or a ceramic substrate.

A land 14 to be connected to an external terminal is formed on a back surface of the circuit board 10. The land 14 is electrically connected to the circuit pattern 12 via a known connecting means. For example, the land 14 is electrically connected to the circuit pattern 12 via a via filled with conductive material (see FIG. 3) or a through-hole 16 carrying a metal layer plated on the inner wall thereof.

An anisotropic conductive adhesive film (ACF) 20 is adhered on the circuit board 10. Thereby, an anisotropic conductive adhesive layer is formed on the strip-like substrate 11 at least in portions corresponding to semiconductor chip-mounting areas of the respective circuit boards 10. The anisotropic conductive adhesive film 20 is formed, for example, of an adhesive component 21 composed of thermosettable resin (such as epoxy resin) or thermoplastic resin (such as polyolefin resin or polyimide resin) wherein conductive particles 22 are dispersed. As shown in FIG. 2, the conductive particles 22 have a uniform particle size (for example, about 5 $\mu$m) and are distributed at a generally equal pitch to form a single layer in the adhesive 21 component solely in the vicinity of one surface thereof. The conductive particle may be a nickel ball with or without gold plating thereon, or a resin ball with gold plating thereon. The adhesive component 21 forming a matrix resin of the anisotropic conductive adhesive film 20 may be epoxy resin or others. A thickness of the anisotropic conductive adhesive film 20 is usually several tens of $\mu$m, for example, 50 $\mu$m.

FIG. 2 shows that a film-like anisotropic conductive adhesive is protected on opposite sides thereof with release papers 24, 26. The adhesive film is first adhered to the circuit board 10 by releasing the release paper 24, and then a semiconductor chip 30 is adhered to the adhesive film by releasing the release paper 26.

In this regard, an anisotropic conductive adhesive of a paste type may be coated onto the respective chip-mounting areas of the circuit board.

The semiconductor chip 30 has electrode terminals 32 on a surface to be bonded to the circuit board 10 via the anisotropic adhesive film 20 at positions corresponding to electrode terminal contacts 12a provided on the circuit pattern 12. The electrode terminal 32 is formed on a pad of the semiconductor chip 30, for example, by a gold bump.

The semiconductor chip 30 is mounted onto the anisotropic adhesive film 20 bonded to the semiconductor chip-mounting area on the circuit board 10, and then is heated to soften the adhesive component 21 of the anisotropic adhesive film while being pressed toward the circuit board 10. In this regard, first, the anisotropic adhesive film may be softened, and then the chip is placed thereon and heat-pressed. Thereby, the electrode terminal 32 penetrates the layer of adhesive 21 to be in contact with the conductive particles 22 and nip the same in association with the electrode terminal contact 12a. Thus, the electrical connection between the electrode terminal and the electrode terminal contact 12a is completed via the conductive particles 22. Thereafter, the adhesive component 21 is cooled and solidified, and the semiconductor chip 30 is easily and reliably bonded to the circuit board 10.

For example, if the circuit pattern 12 is prepared with copper, the electrode terminal 32 is gold and the conductive particle 22 is a nickel ball, the conductive particle 22 nipped between the electrode terminal contact 12a and the electrode terminal 32 is partially embedded into both of them, whereby the electric connection is suitably completed. Also, the embedding of the conductive particle 22 into both of the electrode terminal contact 12a and the electrode terminal 32 causes a wedge action to prevent the semiconductor chip 30 from slipping to or separating from the circuit board 10. Further, this embedding of the conductive particle 22 absorbs the variance (manufacturing error) in height of the electrode terminal 32, the electrical connection becomes reliable.

The production steps of the semiconductor device will be described below with reference to FIG. 3.

Figure 3A:
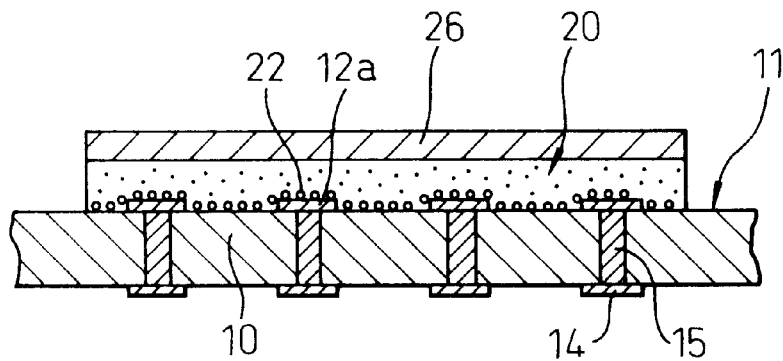
FIGS. 3(a) to 3(f) illustrate the steps for the production method according to the present invention.
Figure 3B:
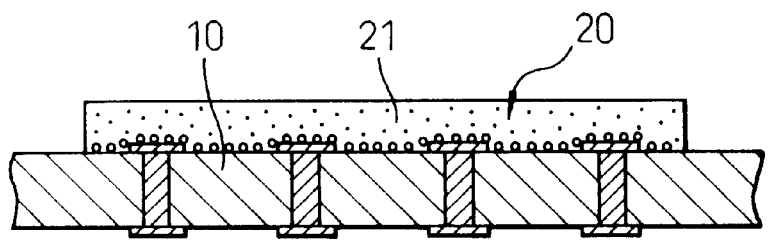
Figure 3C:
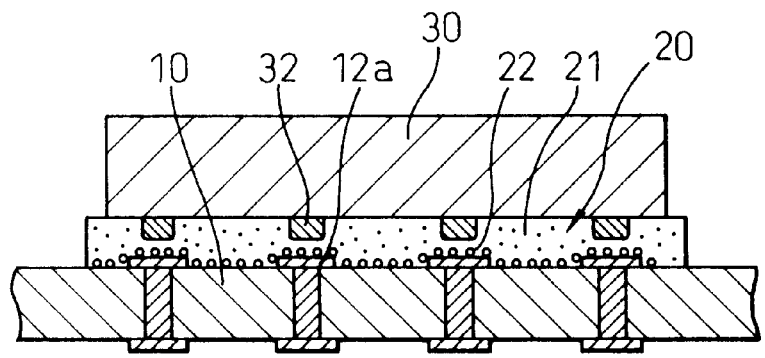
Figure 3D:
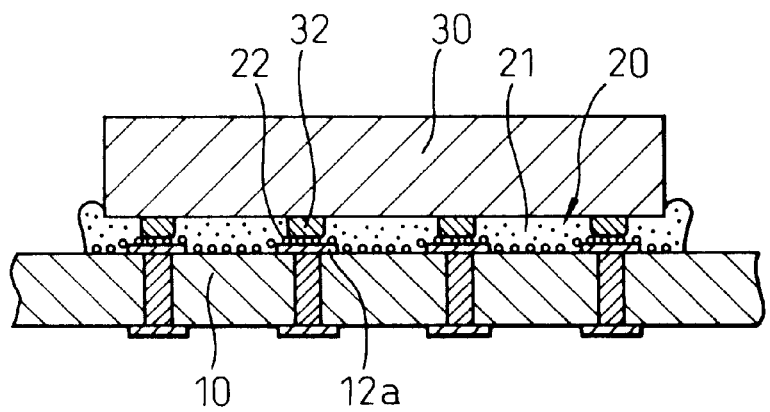
Figure 3E:
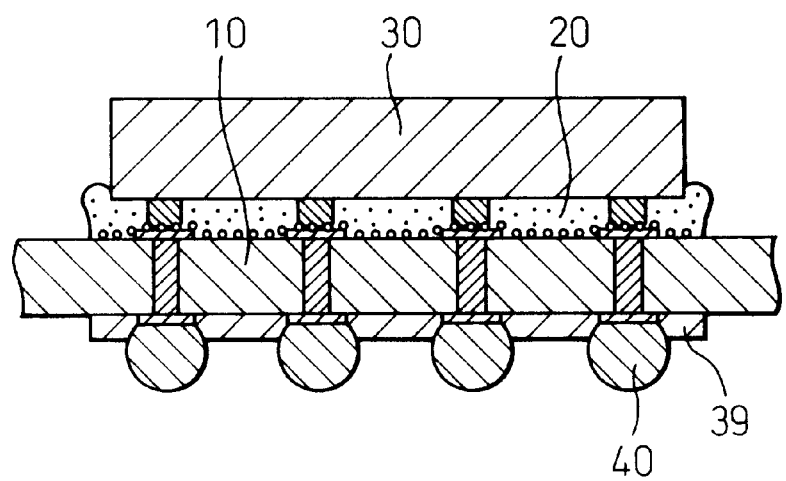
Figure 3F:
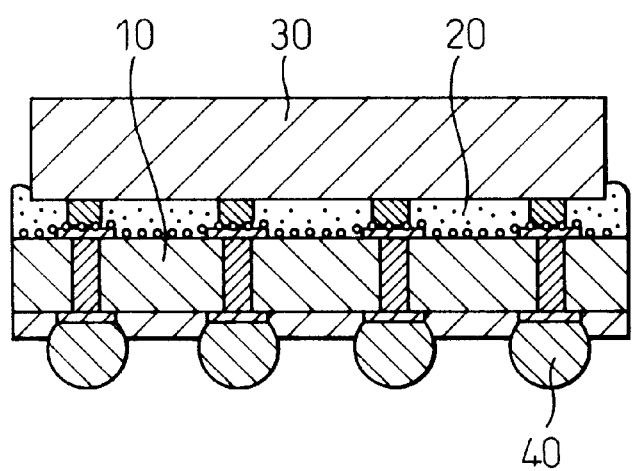

First, as shown in FIG. 3(a), the individual anisotropic conductive adhesive film 20 is bonded, by releasing the release paper 24, to the semiconductor chip-mounting area on the respective circuit board 10 forming the strip-like substrate 11. Then, the release paper 26 is released from the adhesive film (FIG. 3(b)), and the semiconductor chip is placed thereon and temporarily adhered thereto (FIG. 3(c)). Next, the semiconductor chip 30 on the anisotropic conductive adhesive film 20 is accurately positioned so that the electrode terminal 32 coincides with the electrode terminal contact 12a of the circuit pattern. While maintaining this state, the semiconductor chip 30 is heat-pressed toward the circuit board 10, and then cooled (FIG. 3(d)). Thereby, it is possible to electrically connect the electrode terminal 32 with the electrode terminal contact 12a via the conductive particles 22, and also suitably bond the semiconductor chip 30 onto the circuit board 10 with the thermosettable or thermoplastic adhesive component 21 in the anisotropic conductive adhesive film 20. Subsequently, an external terminal is bonded to the land 14 on the back surface of the circuit board 10 (FIG. 3(e)). As an external terminal, a solder ball may be advantageously used. Reference numeral 39 denotes a solder resist. Finally, the strip-like substrate 11 is divided into individual pieces (FIG. 3(f)) to produce finished semiconductor devices.

According to the above process, it is possible to eliminate an underfilling step and a curing step in the conventional process, and to improve the production efficiency. Also, since the semiconductor chip 10 is mounted while being adhered to the anisotropic conductive adhesive film 20, it is possible to avoid the shifting thereof after the mounting, and thus the production yield is enhanced.

Figure 4A:
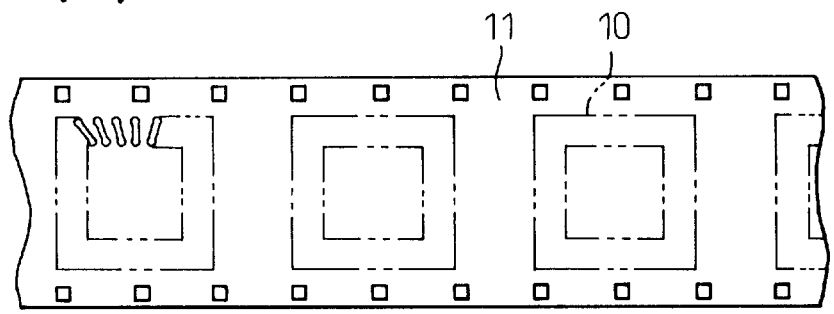
FIGS. 4(a) and 4(b) are plan views illustrating how a strip-like anisotropic conductive adhesive film is adhered to a strip-like substrate.
Figure 4B:
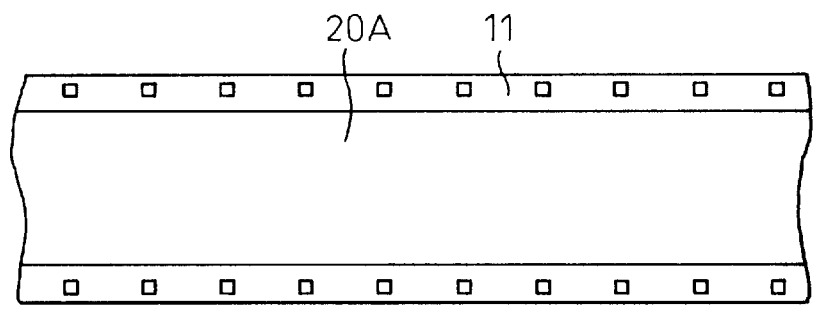
Figure 5:
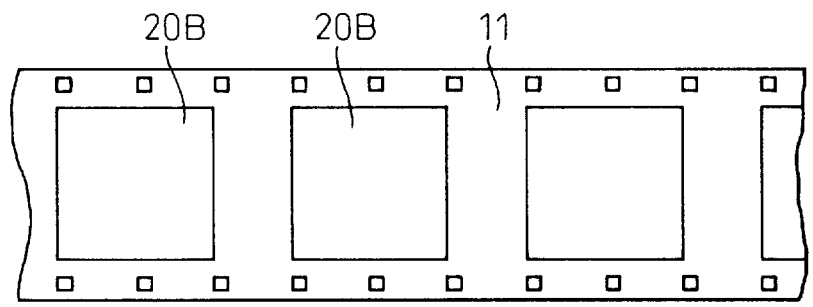
FIG. 5 is a plan view illustrating a state wherein individual anisotropic conductive adhesive films are bonded to the strip-like substrate.
Figure 6:
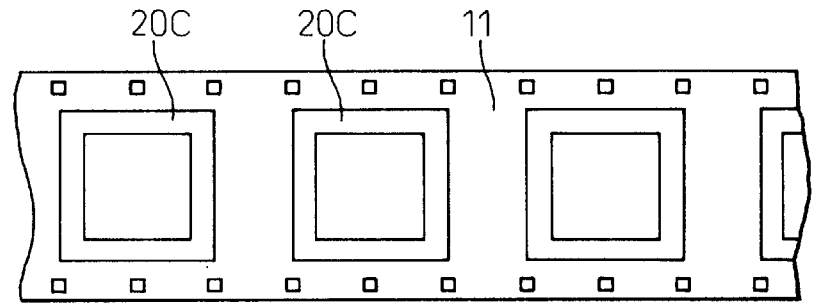
FIG. 6 is a plan view illustrating a state wherein frame-shaped anisotropic conductive adhesive films are bonded to a strip-like substrate.

FIGS. 4 to 6 are plan views for illustrating how an anisotropic conductive adhesive film (20A, 20B, 20C) is supplied in a sheet form along a strip-like substrate 11 consisting of a plurality of circuit boards 10 arranged in a lengthwise direction and adhered to at least an area on the circuit board 10 corresponding to a semiconductor chip mounting area so that an anisotropic conductive adhesive layer is formed.

FIG. 4(a) is a plan view of the strip-like substrate 11.

In FIG. 4(b), the anisotropic conductive adhesive film 20A is continuously supplied onto the strip-like substrate 11 and adhered on the semiconductor chip mounting area of the circuit board 10. The strip-like substrate 11 may have a rectangular form or be in a flexible reel form wherein the substrate is delivered from one reel and taken up onto the other reel. Examples of the rectangular form substrate are a PCB or a ceramic substrate; and those in a reel form are an FPC or a TAB tape. In the rectangular form, the circuit boards may be arranged in a plurality of rows and columns. For example, the circuit boards may be arranged in five rows and five columns. The anisotropic conductive adhesive film 20A may be delivered, for example, from a reel and adhered onto the respective circuit boards of the strip-like substrate 11 after the removal of release paper 24 (see FIG. 2). In such a manner, the anisotropic conductive adhesive film 20A is effectively adhered to the substrate to form the anisotropic conductive adhesive layer thereon. In this regard, the anisotropic conductive adhesive layer may be formed by coating the anisotropic conductive adhesive on the circuit boards 10.

FIG. 5 illustrates a state wherein individual rectangular pieces 20B of anisotropic conductive adhesive film are adhered to the circuit boards 10. FIG. 6 illustrates a state wherein individual rectangular frames 20C of anisotropic conductive adhesive film are adhered solely to areas on the circuit boards 10 with which the semiconductor chip is electrically connected. Such individual anisotropic conductive adhesive films may be arranged on a release tape at positions corresponding to the respective circuit boards, and supplied together with the release paper, whereby it is possible to continuously and effectively adhere them onto the consecutive circuit boards 10 and thus improve the production efficiency. If such a frame-shaped anisotropic conductive adhesive film is used, it is possible to minimize an amount of adhesive swelling out from the periphery of the semiconductor chip when the semiconductor chip is pressed onto the circuit board.

The anisotropic conductive adhesive film (ACF) is used for mounting the semiconductor chip to the strip-like substrate in the above-mentioned embodiments. A more effective production of semiconductor device will be described below, wherein a semiconductor wafer is used prior to being diced into individual chips.

Figure 7:
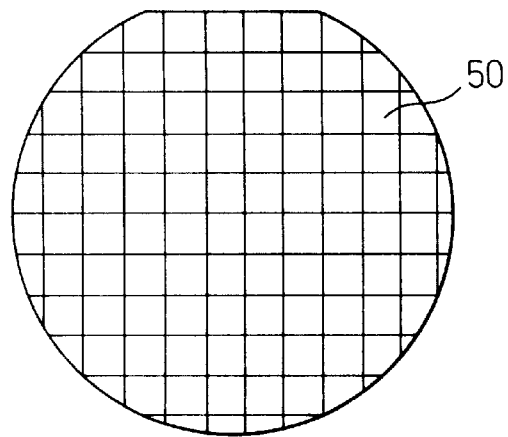
FIG. 7 is a plan view of a semiconductor wafer.
Figure 8:
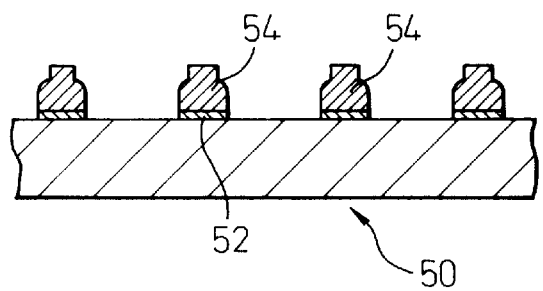
FIG. 8 is a sectional view showing a state wherein stud bump-shaped electrode terminals are formed on the semiconductor wafer.

FIG. 7 is a plan view of a non-diced semiconductor wafer 50. The wafer 50 to be diced into individual pieces in the post process is initially processed to have bump-like electrode terminals 54 on all external output pads 52. FIG. 8 is an enlarged view of the electrode terminals 54 formed thereon. Stud bumps are formed by a wire-bonding method in the illustrated embodiment. The electrode terminal 54 may be formed by a plating method.

Figure 9:
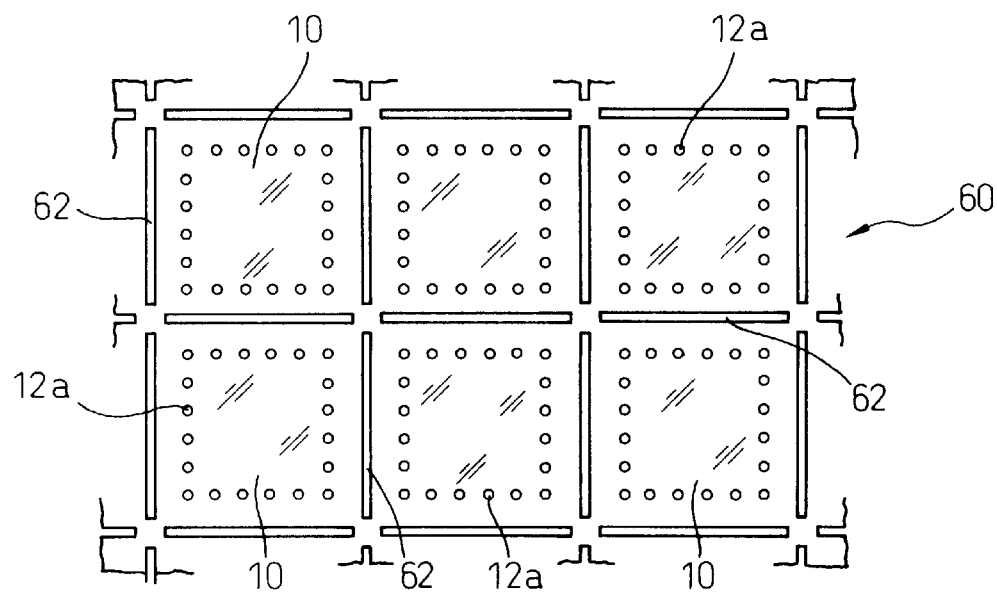
FIG. 9 is an enlarged plan view of part of a wafer-mounting substrate.

Next, the semiconductor wafer 50 forming the electrode terminals 54 thereon is mounted on a large-sized wafer-mounting substrate 60 capable of mounting the semiconductor wafer 50 via the anisotropic conductive adhesive film 20. FIG. 9 illustrates an enlarged view of part of the wafer-mounting substrate 60. The wafer-mounting substrate 60 has electrode terminal contacts 12a formed in coincidence with the arrangement of the electrode terminals 54 of the semiconductor chip. A circuit board 10 is a unit divided into individual pieces by dicing. Reference numeral 62 denotes a slit for dividing the wafer-mounting substrate into individual pieces. The circuit boards 10 are connected to each other by the corners thereof. The reason for providing the slit 62 on the wafer-mounting substrate 60 at a dividing position thereof is to reduce a length to be brought into contact with a dicing edge when the wafer-mounting substrate 60 is divided into individual pieces after the semiconductor wafer 50 is mounted to the substrate 60.

Figure 10A:
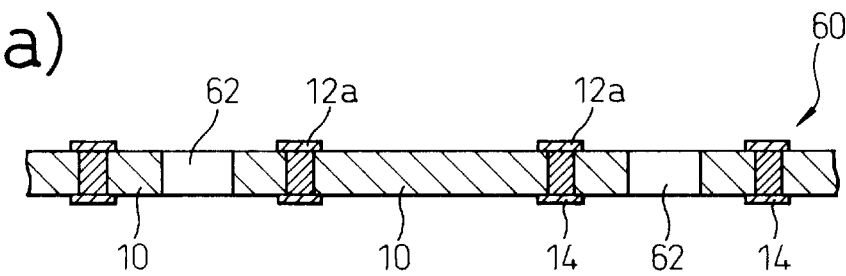
FIGS. 10(a) to 10(d) illustrate the steps for the production method of semiconductor devices while using a semiconductor wafer and a wafer-mounting substrate.
Figure 10B:
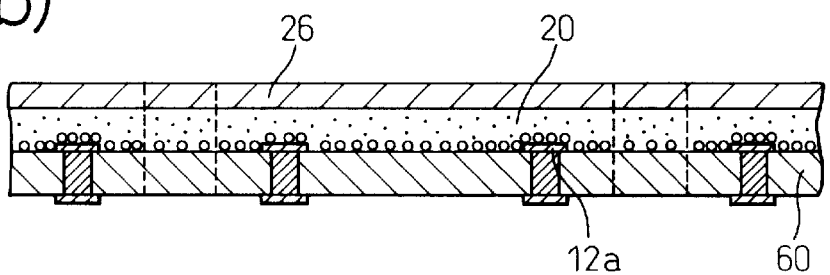

FIG. 10(a) shows a sectional view of the wafer-mounting substrate 60. The structure of the wafer-mounting substrate 60 is similar to that of the strip-like substrate described before, wherein electrode terminal contacts 12a are formed on the semiconductor chip-mounting surface and lands 14 are formed on the external terminal-bonding surface. To mount the semiconductor wafer 50 onto the wafer-mounting substrate 60, the same anisotropic conductive adhesive film 20 as used in the preceding embodiments is adhered to the surface carrying the electrode terminal contacts 12a (FIG. 10(b)). When the anisotropic conductive adhesive film 20 is adhered, a part of the adhesive film 20 in a region where the semiconductor chip is to be adhered is somewhat pressed toward the wafer-mounting substrate 60, and then a release paper 26 is removed, whereby it is possible to prevent the anisotropic conductive adhesive 20a from filling in the slit 62. The wafer-mounting substrate 60 is most conveniently formed with the slits 62 by punching simultaneously the substrate 60 and the anisotropic conductive adhesive film 20 after the adhesive film 20 is adhered to the substrate 60.

Figure 10C:
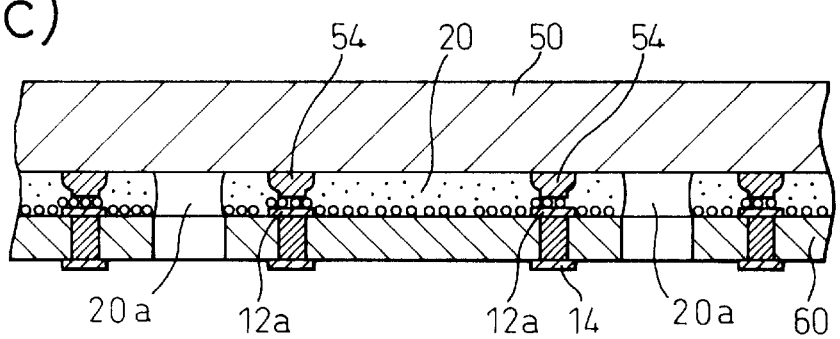

After the anisotropic conductive adhesive film 20 is adhered, the semiconductor wafer 50 is positioned to the wafer-mounting substrate 60 and temporarily adhered thereto. The temporarily adhered semiconductor wafer 50 is heated while being pressed to the wafer-mounting substrate 60. Thus, both are integrally bonded so that the electrode terminal contacts 12a of the wafer-mounting substrate 60 are electrically connected to the electrode terminals 54 of the semiconductor wafer 50 via the conductive particles dispersed in the anisotropic conductive adhesive film 20 (FIG. 10(c)).

Then, a solder ball 40 is bonded to the land 14 as an external terminal. Of course, other means than the solder ball may be used as an external terminal, or no external terminals may be used at all.

Figure 10D:
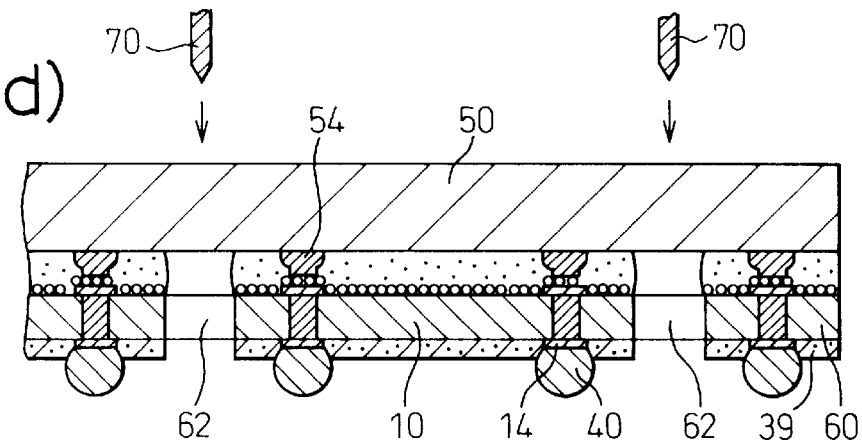

Finally, the assembly of the semiconductor wafer 50 and the wafer-mounting substrate 60 bonded together is diced into individual semiconductor devices. FIG. 10(d) shows a method for dicing the assembly of the semiconductor wafer 50 and the wafer-mounting substrate 60 while using dicing edges 70. The dicing is carried out along the contour of the semiconductor chip in the semiconductor wafer 50. Since the slits 62 are provided in the wafer-mounting substrate 60, the dicing edges 70 are hardly in contact with the wafer-mounting substrate 60, but solely with the semiconductor wafer 50. Generally speaking, the dicing edge is damaged and the performance thereof deteriorates if the same is simultaneously brought into contact with different kinds of materials. The provision of slits 62 in the wafer-mounting substrate 60 as in this embodiment enables the reduction of contact length of the dicing edge 70 with the anisotropic conductive adhesive film 20, which in turn is advantageous in that the assembly of the semiconductor wafer 50 and the wafer-mounting substrate 60 is reliably diced.

Of course, it is also possible to obtain semiconductor devices by a method wherein a flat plate type wafer-mounting substrate 60 having no slits 62 is used, which then is positioned to a semiconductor wafer 50, assembled together and diced into individual pieces.

Figure 11:
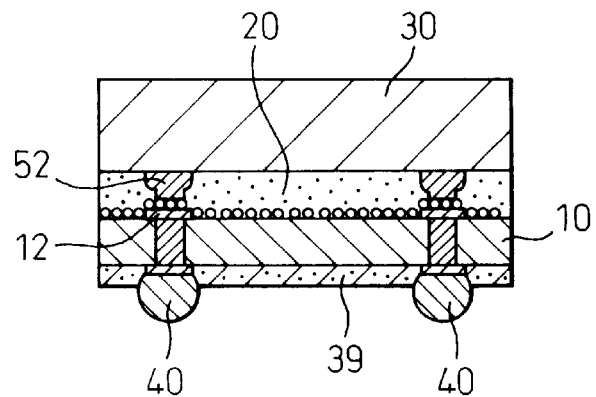
FIG. 11 is a sectional view of a semiconductor device obtained by a method according to the present invention.

FIG. 11 is a sectional view of the semiconductor device obtained according to this embodiment.

Figure 12A:
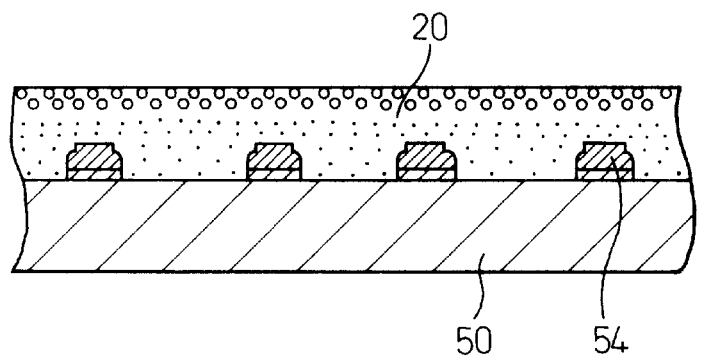
FIGS. 12(a) and 12(b) illustrate the steps for the production method of semiconductor devices by bonding a wafer-mounting substrate to a semiconductor wafer.
Figure 12B:
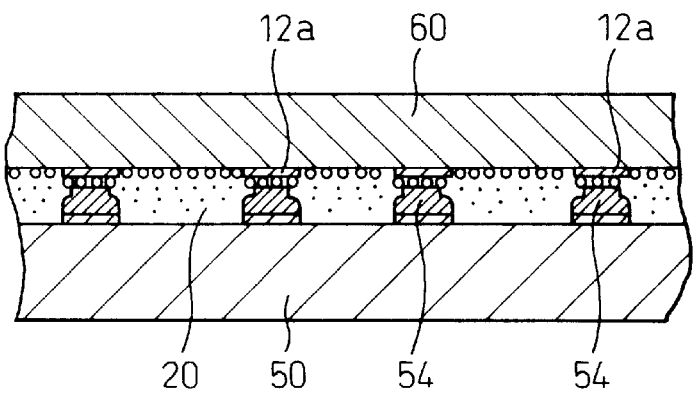

In this regard, according to the above embodiment, the semiconductor device is obtained by adhering the anisotropic conductive adhesive film 20 onto the wafer-mounting substrate 60 provided with the electrode terminal contacts 12a, and bonding the semiconductor wafer 50 thereon. Contrary thereto, as shown in FIG. 12, it is also possible to produce a semiconductor device by laminating an isotropic conductive adhesive film 20 with a semiconductor wafer 50 preliminarily provided with electrode terminals 54 (FIG. 12(a)), positioning and bonding the same to a wafer-mounting substrate 60 via the anisotropic conductive adhesive film 20, and dicing the semiconductor wafer 50 and the wafer-mounting substrate 60 into individual pieces.

The above method is very useful in view of the production efficiency of the semiconductor, wherein the semiconductor device is obtained by bonding the semiconductor wafer 50 with the wafer-mounting substrate 60 via the anisotropic conductive adhesive film 20 and dicing the same into individual pieces. That is, since the non-diced semiconductor wafer 50 is used as it is, the handling thereof becomes easy in comparison with a case wherein individual semiconductor chips are used. Also, since the wafer-mounting substrate 60 has the same arrangement of areas used as circuit boards 10 as that on the semiconductor wafer 50, it is possible to increase the arrangement density of the circuit boards 10, whereby the generation of waste of the substrate is minimized to lower the production cost to a great extent.

According to the present invention, an anisotropic conductive adhesive layer is preliminarily provided in a semiconductor chip-mounting area of each of circuit boards, which is then softened and pressed by a semiconductor chip to suitably bond the same with the circuit board. Thus, it is possible to eliminate the underfilling step and the curing step as in the prior art process, which simplifies the process. Also, the use of a strip-like substrate enables the simultaneous treatment of a plurality of circuit boards and results in the improvement in production efficiency. If a method is adopted wherein a semiconductor wafer and a wafer-mounting substrate are used, the production efficiency of semiconductor devices is further enhanced.

It should be understood by those skilled in the art that the foregoing description relates to some of the preferred embodiments of the disclosed invention, and that various changes and modifications may be made to the invention without departing from the spirit and scope thereof.

We claim:

1. A process for producing a semiconductor device, said process comprising the steps of:

forming an anisotropic conductive adhesive layer, which includes a thermoplastic or thermosetting resin and conductive particles which have a uniform particle size and are distributed in generally equal pitch to form a single layer in the adhesive component in the vicinity of one surface thereof adjacent to the circuit board dispersed therein, on a surface of a circuit board on which electrode terminal contacts are arranged so as to correspond to electrode terminals of a semiconductor chip which is to be mounted on said circuit board;

softening said anisotropic conductive adhesive layer;

placing said semiconductor chip in such a manner that said electrode terminals of the semiconductor chip coincide with said electrode terminal contacts of the circuit board through said anisotropic conductive adhesive layer; and pressing said semiconductor chip against said circuit board so that said electrode terminals are electrically connected to said electrode terminal contacts and, simultaneously, said semiconductor chip is physically fixed to said circuit board when said anisotropic conductive adhesive layer is hardened.

2. A process as set forth in claim 1, wherein said anisotropic conductive adhesive layer is formed on said surface of the circuit board at least on an area on which said semiconductor chip is mounted.

3. A process as set forth in claim 1, wherein said a strip-like circuit board comprising a plurality of said circuit boards continuously arranged in a longitudinal direction is used and said anisotropic conductive adhesive layer is formed on said surface of the respective circuit board at least on an area on which the respective semiconductor chip is mounted.

4. A process as set forth in claim 3, wherein said anisotropic conductive adhesive layer is formed on said strip-like circuit board along a longitudinal direction thereof, including at least semiconductor chip mount areas of the respective circuit boards.

5. A process as set forth in claim 1, wherein said circuit board is a flexible circuit board.

6. A process as set forth in claim 1, wherein said electrode terminal contacts are arranged in an frame-shaped area of said circuit board and said anisotropic conductive adhesive layer is formed along said frame-shaped area.

7. A process as set forth in claim 3, wherein said circuit board is provided, on a second surface opposite to said first surface on which said electrode terminal contacts and a wiring pattern are arranged, with conductive lands electrically connected to said wiring pattern and, after said semiconductor chip is mounted on said circuit board, external connecting terminals are attached to said conductive lands.

8. A process for producing a semiconductor device, said process comprising the following steps of:

preparing a semiconductor wafer forming a plurality of semiconductor chips having bump-like electrode terminals;

preparing a wafer-mounting substrate having electrode terminal contacts arranged so as to correspond to said electrode terminals;

forming an anisotropic conductive adhesive layer, which includes a thermoplastic or thermosetting resin and conductive particles which have a uniform particle size and are distributed in generally equal pitch to form a single layer in the adhesive component in the vicinity of one surface thereof adjacent to the circuit board dispersed therein, on a surface of said wafer-mounting substrate on which electrode terminal contacts are arranged;

placing said semiconductor wafer in such a manner that said electrode terminals of the semiconductor wafer coincide with said electrode terminal contacts of the wafer-mounting substrate through said anisotropic conductive adhesive layer;

pressing said semiconductor wafer against said wafer-mounting substrate so that said electrode terminals are electrically connected and, simultaneously, said semiconductor wafer is fixed to said electrode terminal contacts and to said circuit board; and cutting said semiconductor wafer and said wafer-mounting substrate into individual pieces including respective semiconductor chips.

9. A process as set forth in claim 8, wherein said wafer-mounting substrate is provided with slits along which said semiconductor chip and said wafer-mounting substrate are cut into said individual pieces.

10. A process as set forth in claim 8, wherein said electrode terminal contacts are arranged in frame-shaped areas of said wafer-mounting substrate and said anisotropic conductive adhesive layer is formed along said respective frame-shaped area.

11. A process as set forth in claim 8, wherein said wafer-mounting substrate is provided, on a second surface opposite to said first surface on which said electrode terminal contacts and a wiring pattern are arranged, with conductive lands electrically connected to said wiring pattern.

12. A process as set forth in claim 8, wherein slits are formed along outer peripheries of regions, on which semiconductor chips are to be mounted, after said anisotropic conductive adhesive film is adhered to said wafer-mounting substrate.

13. The method of claim 1 wherein the anisotropic conductive adhesive layer includes a non-conductive resin of an epoxy, polyolefin or polyamide and conductive particles of resin balls having a metal plating thereon or metal balls.

14. The method of claim 8 wherein the anisotropic conductive adhesive layer includes a non-conductive resin of an epoxy, polyolefin or polyamide and conductive particles of resin balls having a metal plating thereon or metal balls.

* * * * *

UNITED STATES PATENT AND TRADEMARK OFFICE
CERTIFICATE OF CORRECTION

PATENT NO. : 5,918,113

DATED : June 29, 1999

INVENTOR(S) : Mitsutoshi Higashi et al.

It is certified that error appears in the above-identified patent and that said Letters Patent is hereby corrected as shown below:

Column 10, line 13 (claim 13, line 3): change "polyamide" to --polyimide--.

Column 10, line 18 (claim 14, line 3): change "polyamide" to --polyimide--.

Signed and Sealed this

Twenty-second Day of August, 2000

Attest:

Q. TODD DICKINSON

*Attesting Officer*   *Director of Patents and Trademarks*